(12) United States Patent
Okazaki

(10) Patent No.: US 8,217,271 B2
(45) Date of Patent: Jul. 10, 2012

(54) MULTILAYERED WIRING BOARD

(75) Inventor: Toru Okazaki, Osaka (JP)

(73) Assignee: Panasonic Corporation, Osaka (JP)

( * ) Notice: Subject to any disclaimer, the term of this patent is extended or adjusted under 35 U.S.C. 154(b) by 249 days.

(21) Appl. No.: 12/615,593

(22) Filed: Nov. 10, 2009

(65) Prior Publication Data

US 2010/0116530 A1 May 13, 2010

(30) Foreign Application Priority Data

Nov. 13, 2008 (JP) ................................. 2008-291073

(51) Int. Cl.
*H05K 1/03* (2006.01)
(52) U.S. Cl. .......... 174/255; 174/250; 174/256; 29/825; 29/829; 29/846; 442/208
(58) Field of Classification Search ................. 174/250, 174/255–258; 29/825, 829, 831, 846; 442/181, 442/208–209, 212–213
See application file for complete search history.

(56) References Cited

U.S. PATENT DOCUMENTS

| | | | | |
|---|---|---|---|---|
| 4,282,011 A * | 8/1981 | Terpay | ............................. | 51/298 |
| 4,814,945 A * | 3/1989 | Leibowitz | ..................... | 361/792 |
| 4,876,120 A * | 10/1989 | Belke et al. | ................... | 428/1.54 |
| 5,168,006 A * | 12/1992 | Inoguchi et al. | ............. | 442/187 |
| 5,206,078 A * | 4/1993 | Inoguchi et al. | ............. | 442/187 |
| 5,435,877 A * | 7/1995 | Ishii et al. | ..................... | 156/264 |
| 6,136,733 A * | 10/2000 | Blumberg et al. | ............ | 442/247 |
| 6,314,118 B1 | 11/2001 | Jayaraman et al. | | |
| 6,387,830 B1 * | 5/2002 | Blumberg et al. | ............ | 442/103 |
| 6,586,352 B1 * | 7/2003 | Blumberg et al. | ............ | 442/181 |
| 6,841,026 B2 * | 1/2005 | Blumberg et al. | ............ | 156/285 |
| 8,022,310 B2 * | 9/2011 | Okazaki et al. | ................ | 174/255 |
| 8,124,879 B2 * | 2/2012 | Ogura | ............................ | 174/250 |
| 2007/0190879 A1 * | 8/2007 | Gondoh et al. | ................ | 442/181 |
| 2009/0218672 A1 * | 9/2009 | Nakamura et al. | ............. | 257/690 |
| 2010/0051327 A1 | 3/2010 | Ogatsu | | |
| 2010/0294554 A1 * | 11/2010 | Okazaki | ........................ | 174/261 |
| 2011/0067901 A1 * | 3/2011 | Kim et al. | ...................... | 174/250 |
| 2011/0076472 A1 * | 3/2011 | Kim et al. | ...................... | 428/213 |

FOREIGN PATENT DOCUMENTS

| | | | |
|---|---|---|---|
| JP | 04027189 A * | 1/1992 | |
| JP | 2000-151015 A | 5/2000 | |
| JP | 2000-151035 | 5/2000 | |
| WO | WO 2008/056500 | 5/2008 | |

OTHER PUBLICATIONS

JPCA Standard "Build-Up Wiring Board", (Terminology), (Test Method), JPCA-BU01-2007, Japan Electronics Packaging and Circuits Association; w/ partial English translation thereof.
"Analysis of Stress and Deflection of Printed Plate Board Using Multilayered Beam Theory," Transactions of the Japan Society of Mechanical Engineers (A), vol. 59, No. 563 (Jul. 1993), Paper No. 92-1435; w/ partial English translation thereof.

* cited by examiner

*Primary Examiner* — Robert J Hoffberg
(74) *Attorney, Agent, or Firm* — McDermott Will & Emery LLP

(57) ABSTRACT

A multilayered wiring board is composed of n wiring layers and (n−1) resin base material layers, which are alternately laminated. The (n−1) resin base material layers include fiber bundles impregnated with resin. The n wiring layers include wiring patterns and resin. When half of the wiring layers in the thickness direction of the multilayered wiring board differ in the copper remaining ratio from the other half, the multilayered wiring board might be warped during heating. The crossing point density of fiber bundles in each resin base material layer is adjusted so as to cancel the warpage caused by the difference in the copper remaining ratio between the wiring layers.

10 Claims, 9 Drawing Sheets

(amount of warpage: 668 μm)

(amount of warpage: 483 μm)

(amount of warpage: 883 μm)

(amount of warpage: 694 μm)

(amount of warpage: 840 μm)

(amount of warpage: 1058 μm)

MULTILAYERED WIRING BOARD

FIELD OF THE INVENTION

The present invention relates to build-up multilayered wiring boards with two or more wiring layers.

BACKGROUND OF THE INVENTION

Build-up multilayered wiring boards are wiring boards developed for densely mounting various electronic components. The build-up multilayered wiring boards are used in various digital and/or mobile devices, and structured in such a manner that a plurality of wiring layers composed of copper wiring and resin and a plurality of resin base material layers composed of resin and fiber bundles are alternately laminated.

First, a typical build-up multilayered wiring board will be described. FIG. 12 illustrates a partial cross section of a build-up multilayered wiring board 100g (in some cases below, simply referred to as a "board"). In the board 100g, n (where n is an even number of 4 or more) wiring layers (C1 to Cn) and (n−1) resin base material layers [B1 to B(n−1)] are alternately laminated. Hereinafter, when collectively referring to each of the wiring layers and the resin base material layers, they will be indicated as "wiring layers C" and "resin base material layers B", respectively.

The wiring layers C include copper wiring 101 and insulating resin 103. The resin base material layers B typically include plain-woven fiber bundles 102 impregnated with the insulating resin 103. Also, some of the wiring layers C (in the example shown, the wiring layers C1, C2, and Cn) include dummy wiring 108 to be described later. Note that FIG. 12 schematically illustrates the resin base material layers B with the fiber bundles 102 being impregnated with the resin 103. Similar illustrations are provided in other figures to be described later.

The fiber bundles 102 are typically glass fibers or aramid fibers. Also, the insulating resin 103 is thermosetting resin such as epoxy resin, phenol resin, polyimide, or BT resin (bismaleimide triazine resin).

Typically, the wiring layers C and the resin base material layers B are formed by alternately layering fiber bundles impregnated with insulating resin and copper foil having a wiring pattern formed thereon and curing the resin under pressure and heat (laminating press). Also, the resin 103 included in the wiring layers C is formed by a part of the resin in the impregnated fiber bundles entering gaps in the wiring pattern under pressure and heat.

Although not shown, the resin base material layers B have via holes or through holes formed therein, so that adjacent wiring layers C are electrically connected with each other via the via holes or the through holes. Note that the structure of such a build-up multilayered wiring board is defined in detail in the JPCA standard "Build-up Wiring Boards" (Standard No. JPCA-BU01-2007; see in particular Example Structures 3 and 4 on page 2).

The resin base material layers B are divided into a base layer 104, which is the central layer of the multilayered structure formed by laminating press as described above, and build-up layers 105, which are layered above and below the base layer 104. The same or different resin base materials may be used to form the base layer 104 and the build-up layers 105. On the other hand, the resin base materials having the same fiber bundle weave and content are used for the build-up layers 105.

In reflow soldering, the board 100g is placed on a reflow belt or pallet with electronic components being temporarily fixed on its top and bottom mounting surfaces. The board 100g is heated from room temperature to 220° C. or higher, and then cooled to room temperature after soldering. At this time, the board 100g might be warped due to the difference in the amount of thermal expansion between wiring layers, which are attributed to the difference in the copper remaining ratio (the area ratio of copper wiring in the entire wiring layer C) between the wiring layers. The mechanism in which the board is warped will be concretely described with reference to FIG. 13.

A board 100h shown in FIG. 13 has six wiring layers (from top, C1 to C6), and five resin base material layers provided between the wiring layers (from top, B1, B2 (build-up layers 105), B3 (base layer 104), and B4 and B5 (build-up layers 105)). The copper remaining ratios for the wiring layers are 32%, 28%, 37%, 46%, 52%, and 54% in order from the wiring layer C1. In this case, when the average copper remaining ratios are calculated for the layers (C1 to C3) overlying the base layer 104 (resin base material layer B3) and the underlying layers (C4 to C6), the average copper remaining ratio for the underlying layers is higher.

Comparison between the copper wiring 101 and the resin 103 included in the wiring layers C shows that the resin 103 has a higher linear expansion coefficient than the copper wiring 101. Accordingly, any wiring layer with a high copper remaining ratio has a lower amount of thermal expansion under temperature load. As a result, in the board 100h shown in FIG. 13, generally, the layers overlying the base layer 104 have a high amount of thermal expansion, and the underlying layers have a low amount of thermal expansion. Thus, when the temperature rises, the board 100h is warped convexly.

Mounting electronic components with the board being warped due to reflow soldering results in significantly reduced connection reliability between the electronic components and the board, which is a major factor for quality degradation of electronic circuits having the multilayered wiring board incorporated therein.

Conventionally, in order to prevent the board to be warped at the time of reflow soldering, the wiring layers are formed with the same copper remaining ratio to the greatest extent possible (see Japanese Laid-Open Patent Publication No. 2000-151035). Specifically, in order to minimize the difference in the amount of thermal expansion between the wiring layers resulting from the difference in the copper remaining ratio, dummy patterns are formed on the wiring layers in addition to the wiring to be included in the electronic circuit.

BRIEF SUMMARY OF THE INVENTION

However, in the case of boards for use in compact electronic equipment which requires high-density mounting, the area occupied by lands for mounting electronic components is larger, and therefore a sufficient space cannot be secured for providing the dummy patterns. Also, in the case where components operating at high frequency are mounted on the board, formation of the dummy patterns results in generation of noise, and therefore provision of the dummy patterns is restricted. In this manner, the conventional approach with the dummy patterns is limited in its capability to reduce board warpage.

Therefore, an object of the present invention is to provide a multilayered wiring board with reduced warpage even when there is no sufficient space for providing dummy patterns on wiring layers or it is not possible to provide dummy patterns on wiring layers.

To attain the object mentioned above, the present invention provides a multilayered wiring board comprising n (where n is an integral number of 4 or more) wiring layers including wiring and insulating resin, and (n−1) resin base material layers including fiber bundles impregnated with insulating resin, the wiring layers and the resin base material layers being alternately laminated, wherein, at least one of the (n−1) resin base material layers is an adjustment layer with fiber bundles different in a crossing point density from those of the other resin base material layer or layers.

While the novel features of the invention are set forth particularly in the appended claims, the invention, both as to organization and content, will be better understood and appreciated, along with other objects and features thereof, from the following detailed description taken in conjunction with the drawings.

DETAILED DESCRIPTION OF THE INVENTION

Hereinafter, a multilayered wiring board according to the present invention will be described with reference to the drawings. First, the principle for reducing warpage of the multilayered wiring board will be described.

Figure 1:
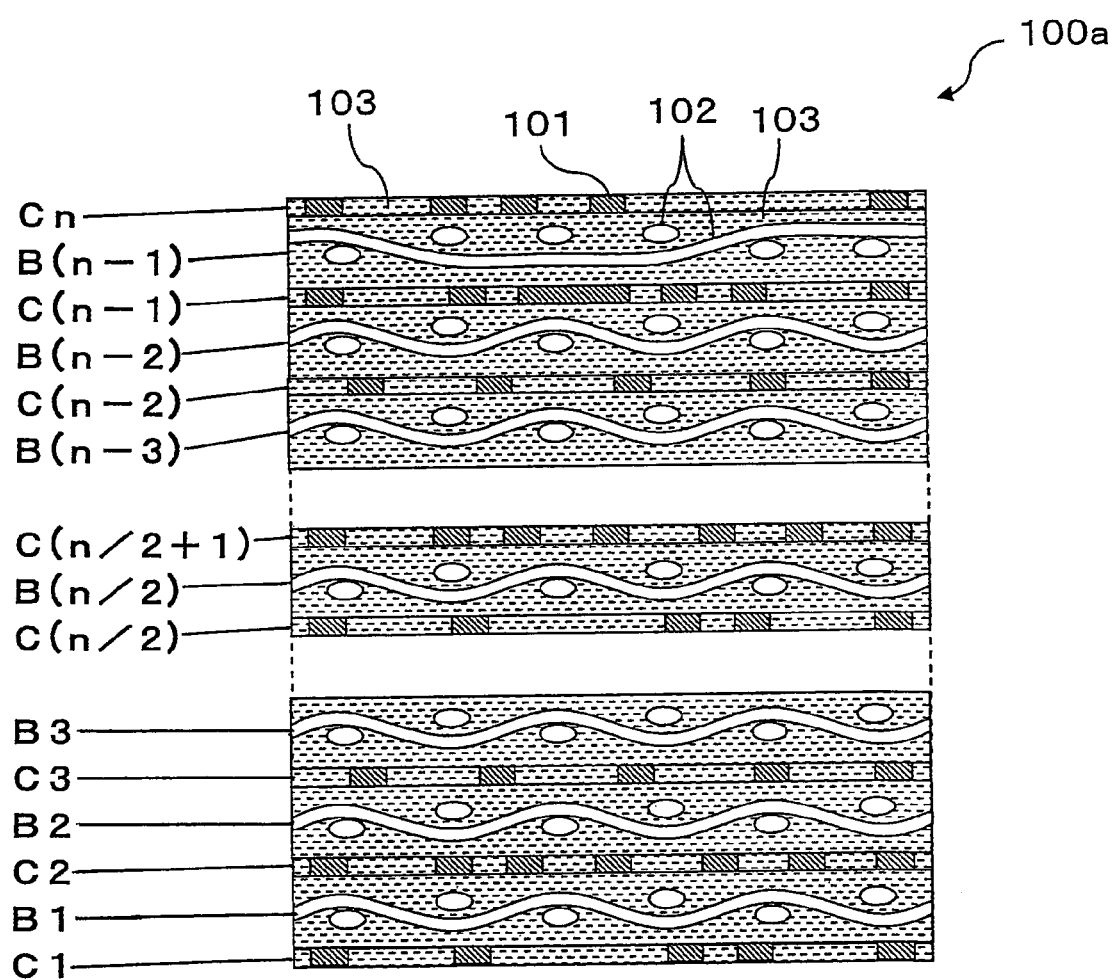
FIG. 1 is a cross-sectional view illustrating the structure of a multilayered wiring board according to the present invention.

FIG. 1 illustrates a partial cross section of a multilayered wiring board 100a according to an embodiment of the present invention. In the board 100a, n (where n is an even number of 4 or more) wiring layers (C1 to Cn) and (n−1) resin base material layers [B1 to B(n−1)] are alternately laminated. The wiring layers C include copper wiring 101 and insulating resin 103. Also, the resin base material layers B include fiber bundles 102 in the form of a woven or non-woven fabric impregnated with the insulating resin 103. These structures are similar to those for the conventional board shown in FIG. 12, and elements thereof are also equal in function to those of the board. The same applies in the following description.

In the multilayered wiring board 100a, at least one resin base material layer (in FIG. 1, the resin base material layer B(n−1)) includes fiber bundles with a different crossing point density from those in other layers, i.e., the number of crossing points between warp and weft threads per unit area in the at least one resin base material layer is different.

The present inventor has conducted studies finding that the amount of thermal expansion varies between resin base material layers different in the crossing point density of their fiber bundles, even if the resin base material layers are equal in fiber bundle content. Specifically, the higher the crossing point density of the fiber bundles, the lower the amount of thermal expansion of the resin base material layer, which results in lower amount of thermal expansion of the resin base material layer including the fiber bundles. Accordingly, using resin base material layers different in the crossing point density of their fiber bundles makes it possible that the difference in the amount of thermal expansion between the wiring layers, which results from the difference in the copper remaining ratio between the wiring layers, is canceled by the difference in the amount of thermal expansion between the resin base material layers.

In general, the crossing point density varies between weaves, and therefore the difference in the crossing point density can be adjusted by changing fiber bundle weaves. Specifically, combining a plurality of resin base material layers including different fiber bundle weaves makes it possible to adjust the amount of thermal expansion between the wiring layers and cancel the difference in the amount of thermal expansion between the wiring layers, thereby reducing board warpage.

Figure 2A:
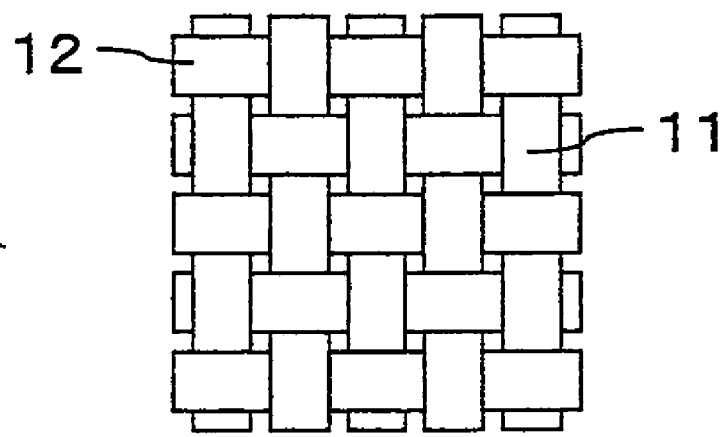
FIG. 2A is a plan view schematically illustrating a plain weave.
Figure 2B:
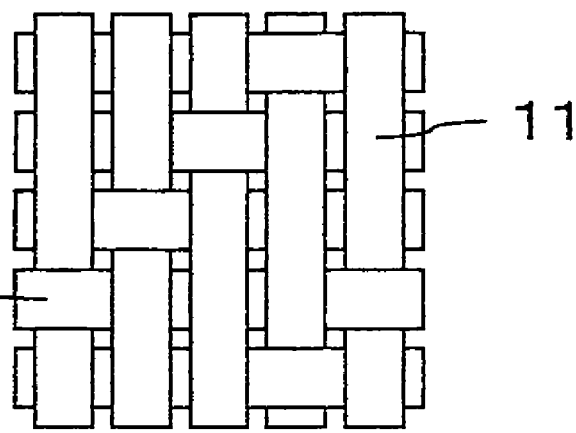
FIG. 2B is a plan view schematically illustrating a twill weave.
Figure 2C:
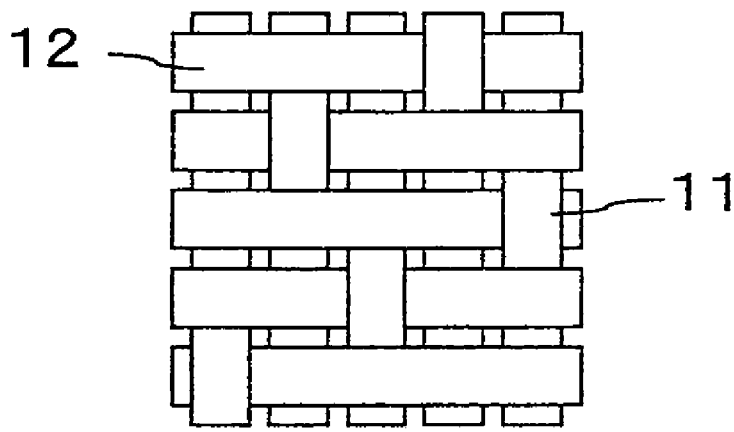
FIG. 2C is a plan view schematically illustrating a satin weave.

FIGS. 2A to 2C illustrate basic fiber bundle weaves. FIGS. 2A, 2B, and 2C are views respectively illustrating plain, twill, and satin weaves. When fiber bundles are made using the same type of threads, the crossing point density generally decreases in order: plain weave fabric, twill weave fabric, satin weave fabric, and non-woven fabric. The difference is attributed to patterns of weaving. The types of weaves will be briefly described below.

The "plain weave" has one warp thread 11 crossing every one weft thread 12, as shown in FIG. 2A, and has the highest crossing point density among the aforementioned types of weaves.

The "twill weave" has two or more parallel warp or weft threads 11 or 12 crossing every two or more of the other type of threads (weft) 12 or (warp) 11, as shown in FIG. 2B. While the plain fabric is woven into only one weaving pattern, the twill weave and the satin weave to be described below can be woven into a plurality of weaving patterns. The twill weave shown in FIG. 2B is referred to as "3/1 regular 4-harness twill".

The "satin weave" has fewer crossing points between warp threads 11 and weft threads 12, which cross at regular intervals, as shown in FIG. 2C. The satin weave shown in FIG. 2C is referred to as "5-harness satin with counter 3".

Although not shown, the "non-woven fabric", unlike the above three weaves, is made by physically, chemically, or mechanically entangling or bonding relatively short fibers. Note that as the name suggests; the non-woven fabric is not made by weaving fibers or threads, and usually it is not categorized as a weave, but the non-woven fabric is considered herein as one of the weaves for convenience.

Also, in practice, the non-woven fabric has crossing points where the fibers cross. However, the strength of binding between the fibers at the crossing points is weak compared to textile fabrics such as plain weave. Accordingly, in the present invention, the non-woven fabric is considered to have a lower crossing point density than other textile fabrics, including at least the plain weave, the twill weave, and the satin weave.

Table 1 shows simulation results for the modulus of longitudinal elasticity and the linear expansion coefficient of resin base material layers B including fiber bundles in the form of the woven fabrics shown in FIGS. 2A to 2C and in the form of non-woven fabric. In the simulation, the resin 103 had a modulus of longitudinal elasticity of 10000 (MPa), a linear expansion coefficient of $50 \times 10^{-6}$ (1/° C.), and the fiber bundles 102 had a modulus of longitudinal elasticity of 100000 (MPa) and a linear expansion coefficient of $5 \times 10^{-6}$ (1/° C.). The fiber bundles 102 were embedded in the thermally cured resin 103 with a fiber bundle content of 33% by weight.

Note that when the weft threads and the warp threads are arranged in directions X and Y, respectively, the twill weave and the satin weave, when viewed partially, have crossing points differently distributed in directions X and Y. However, the crossing points are repeated in regular cycles, and therefore the simulation was conducted without considering the directional differences.

TABLE 1

| | weave | | | |
|---|---|---|---|---|
| | plain | twill | satin | non-woven |
| modulus of longitudinal elasticity (MPa) | 26968 | 26567 | 26483 | 24038 |
| linear expansion coefficient (1/° C.) | $21 \times 10^{-6}$ | $22 \times 10^{-6}$ | $23 \times 10^{-6}$ | $26 \times 10^{-6}$ |

As is apparent from the simulation results in Table 1, the linear expansion coefficient of the resin base material layer B increases in order: plain weave fabric, twill weave fabric, satin weave fabric, and non-woven fabric.

At present, the mechanism in which the amount of thermal expansion varies due to the difference in the crossing point density between fiber bundles is not clarified. Presumably, the amount of thermal expansion varies between resin base material layers due to the following mechanism.

As shown in FIG. 1, the fiber bundles 102 are embedded in the thermally cured resin 103. When the fiber bundles have no crossing points, the warp threads and the weft threads can be free to expand individually. However, when there are crossing points, for example, the weft threads constrain the warp threads from expanding freely, so that the warp threads are deformed in the direction perpendicular to the fiber arrangement direction. Such a phenomenon is believed to occur in each of the warp threads and the weft threads, so that fiber bundles with a higher crossing point density are more greatly inhibited from thermal expansion in the fiber arrangement direction.

For the aforementioned reasons, the multilayered wiring board according to the present invention uses a plurality of differently woven fiber bundles to achieve different amounts of thermal expansion between the resin base material layers.

Figure 3:
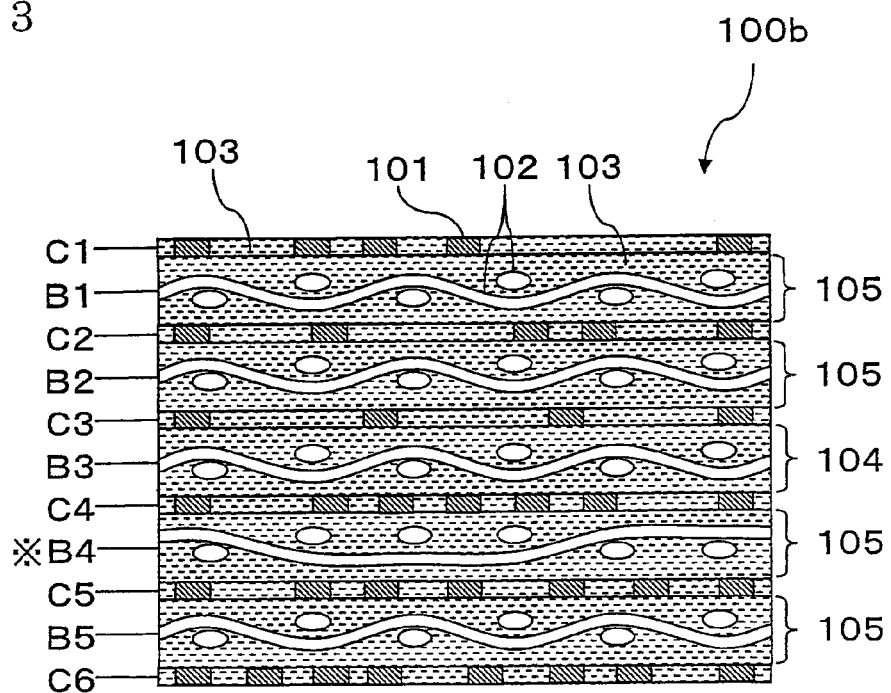
FIG. 3 is a cross-sectional view illustrating the structure of a multilayered wiring board according to an embodiment of the present invention, as used in warpage simulation No. 1.
Figure 12:
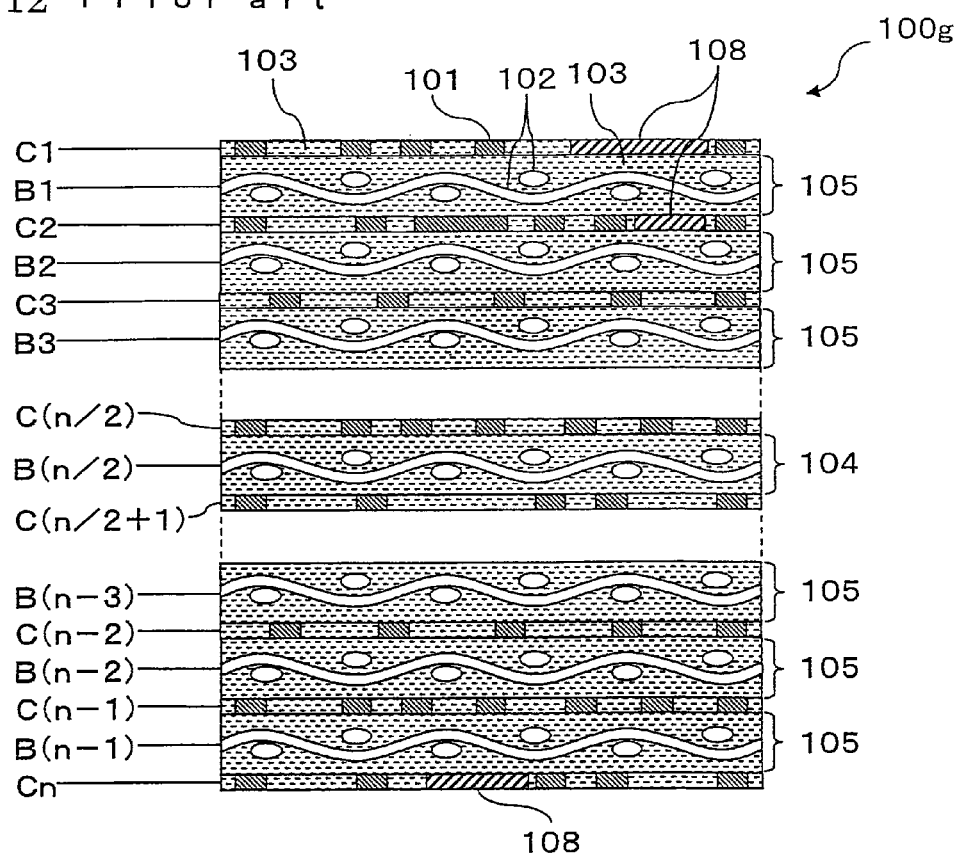
FIG. 12 is a cross-sectional view illustrating the basic structure of a build-up multilayered wiring board.
Figure 13:
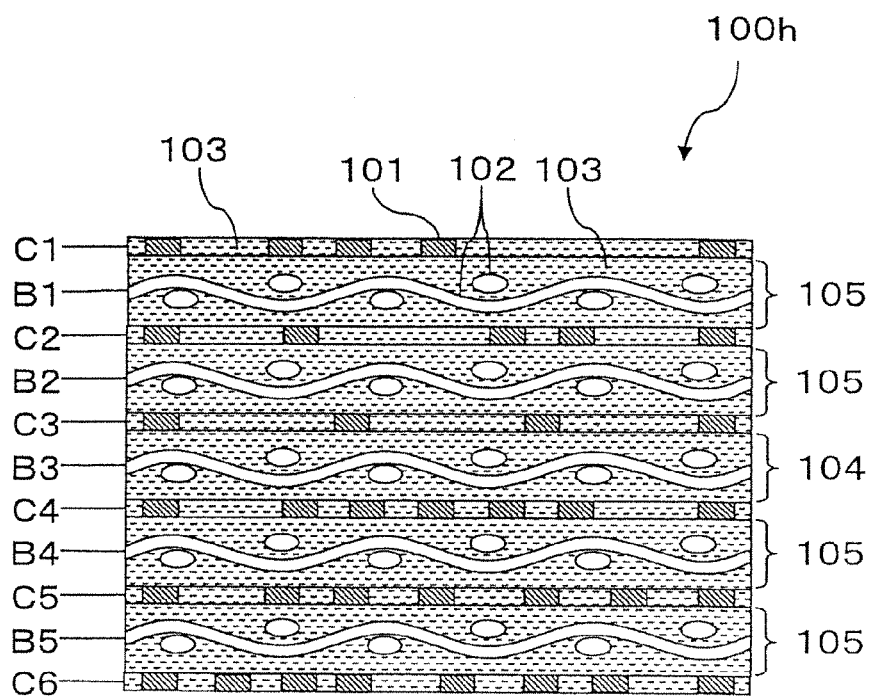
FIG. 13 is a cross-sectional view illustrating the structure of a conventional multilayered wiring board used in warpage simulation No. 2.

FIG. 3 illustrates the structure of a multilayered wiring board 100b where n is 6. The board 100b includes six wiring layers (from top, C1 to C6), and five resin base material layers (from top, B1, B2 (build-up layers 105), B3 (base layer 104), and B4 and B5 (build-up layers 105)) between the respective wiring layers. The copper remaining ratios of the wiring layers are 32%, 28%, 37%, 46%, 52%, and 54% in order from top (C1). Note that the copper remaining ratio is the ratio of the area of copper wiring to the total area of the wiring layer C. Here, the copper remaining ratios are calculated based on CAD (Computer Aided Design) data for the wiring layers C1 to C6. Also, in FIG. 3, the same elements as those of the boards shown in FIGS. 12 and 13 are denoted by the same reference characters, and any detailed description thereof will be omitted. The same applies in the following description.

As described above, the copper remaining ratios of the wiring layers in the board 100b are 32%, 28%, 37%, 46%, 52%, and 54% in order from C1. Average copper remaining ratios for the wiring layers (C1 to C3) overlying the base layer 104 and the underlying layers (C4 to C6) are 32% and 51%, respectively, and therefore the average copper remaining ratio for the layers underlying the base layer 104 is higher.

As described earlier, the amount of thermal expansion of the wiring layer C decreases as the copper remaining ratio of the layer increases. Also, the amount of thermal expansion of the resin base material layer B varies depending on the fiber bundle weave to be used (the crossing point density). Specifically, the amount of thermal expansion is higher in the twill weave than in the plain weave, in the satin weave than in the twill weave, and in the non-woven fabric than in the satin weave. Accordingly, warpage of the board 100b can be reduced by either of the following methods.

(1) For at least one of the build-up layers 105 (resin base material layers B4 and B5) underlying the base layer 104, fiber bundles woven with a greater amount of thermal expansion than in other build-up layers 105 are used.

(2) For at least one of the build-up layers 105 (resin base material layers B1 and B2) overlying the base layer 104, fiber bundles woven with a lower amount of thermal expansion than in other build-up layers 105 are used.

Any of the above methods are effective in reducing board warpage because each resin base material layer B of the board is caused to apply concavely warping force to the wiring layer C on which convexly warping force acts.

Note that in the above methods, two types of resin base material layers different in fiber bundle weave are combined, thereby reducing warpage of the board 100b. In a possible method other than the above, three or more types of differently woven resin base material layers may be used. However, in such a case, it is necessary to prepare a plurality of types of differently woven resin base material layers at the time of board production, leading to an increase in multilayered wiring board production cost.

Hereinafter, the structure of the board 100b according to the present embodiment will be described concretely. In the present embodiment, of the five resin base material layers, the layers B1, B2, B3 and B5 use plain-woven fiber bundles, and only the layer B4 (assigned "*" in FIG. 3) uses twill-woven fiber bundles. Note that for all the resin base material layers, the fiber bundle content is 33% by weight.

First, a method for producing the board 100b will be described. Initially, two types of resin base material layers different in fiber bundle weave were produced. The fiber bundles used were in the form of knitted glass fiber fabrics with an elliptical fiber cross section of 25 µm in long radius and 10 µm in short radius, and epoxy resin was used as insulating resin. At the time of fiber bundle production, fiber weaves were changed such that two types of fiber bundles different in weave structure were produced.

Next, the fiber bundle fabrics thus produced were impregnated with resin, thereby creating resin base material layers using two types of differently woven fiber bundles. When producing the resin base material layers using the differently woven fiber bundles, one of the resin base material layers is changed in color by adding pigment to the resin to such an extent that insulation properties and suchlike are not affected, thereby making it possible to readily distinguish between the resin base material layers. As a result, it is possible to prevent the resin base material layers with differently woven fiber bundles from being arranged in wrong places, thereby enhancing productivity.

Next, laser processing or suchlike was performed to provide holes in predetermined places of the resin base material layers thus produced. The holes were filled with a conductive resin composition made by a mixture of metal powder and thermosetting resin in order to provide inner vias therein. Then, the resin base material layers were covered on both surfaces with two release films each having a wiring pattern formed on one surface, and then heated under pressure. As a result, the resin was cured and the wiring patterns were firmly fixed on the resin base material layers, thereby forming wiring layers. Thereafter, the release films were peeled from the wiring layers formed on the surfaces of the resin base material layers. Note that the wiring patterns may be formed using a method in which wiring patterns are formed by etching resin base material layers after covering the layers on both surfaces with copper foil.

A resin base material layer and a release film having a wiring pattern formed on one surface were mounted on one of the two wiring layers thus obtained, and that wiring layer was placed under pressure and heat after forming inner vias as described above. This process was repeated while layering two types of resin base material layers different in fiber bundle weave in the order shown in FIG. 3, thereby ultimately producing the board 100b with five resin base material layers B and six wiring layers C.

The produced board 100b had the wiring layers C of approximately 10 µm in thickness and the resin base material layers B of approximately 30 µm in thickness. The board 100b thus produced was cut into 50 mm×50 mm pieces, and heated up to 260° C. during reflow process, resulting in 668 µm warpage.

As a comparative example, a board 100h having a structure as shown in FIG. 13 was produced using the same fiber bundles and resin as those used for the board 100b, and then cut into 50 mm×50 mm pieces. The difference between the boards 100b and 100h is in the fiber bundle weave of the resin base material layer B4, since that for the board 100b is twill weave, whereas that for the board 100h is plain weave as with the other resin base material layers. The board 100h was heated up to 260° C. during reflow process, resulting in 840 µm warpage.

Next, board warpage will be described with respect to various fiber bundle weaves selected for one of the four build-up layers 105 (i.e., the resin base material layer B1, B2, B4, or B5). Actual production of one resin base material layer with a different fiber bundle weave adds a great amount of money (millions of yen) to the cost. Accordingly, the following description shows simulation results for warpage of an analytically modeled multilayered wiring board. Note that when creating the analytical model, parameters for calculation formulae were determined such that the simulation results coincided with actually measured warpage values for the boards 100b and 100h.

<Warpage Simulation No. 1>

First, a simulation was conducted where the board 100b of the present embodiment was structured as shown in FIG. 3, i.e., plain-woven fiber bundle were used in four of the five resin base material layers (B1, B2, B3, and B5), and twill-woven fiber bundles were used only for the layer B4. Note that the fiber bundle content was 33% by weight for both the plain- and twill-woven fiber bundle resin base material layers. The copper remaining ratios of the wiring layers were 32%, 28%, 37%, 46%, 52%, and 54% in order from C1. The wiring layers C were 10 µm in thickness, and the resin base material layers B were 30 µm in thickness. Also, the board was 50 mm×50 mm in size.

In the present warpage simulation, physical properties of the elements of the board were as follows: copper wiring 101 with a modulus of longitudinal elasticity of 50000 (MPa) and a linear expansion coefficient of $17 \times 10^{-6}$ (1/° C.); resin 103 with a modulus of longitudinal elasticity of 10000 (MPa) and a linear expansion coefficient of $50 \times 10^{-6}$ (1/° C.); fiber bundle 102 with a modulus of longitudinal elasticity of 100000 (MPa) and a linear expansion coefficient of $5 \times 10^{-6}$ (1/° C.).

Figure 4:
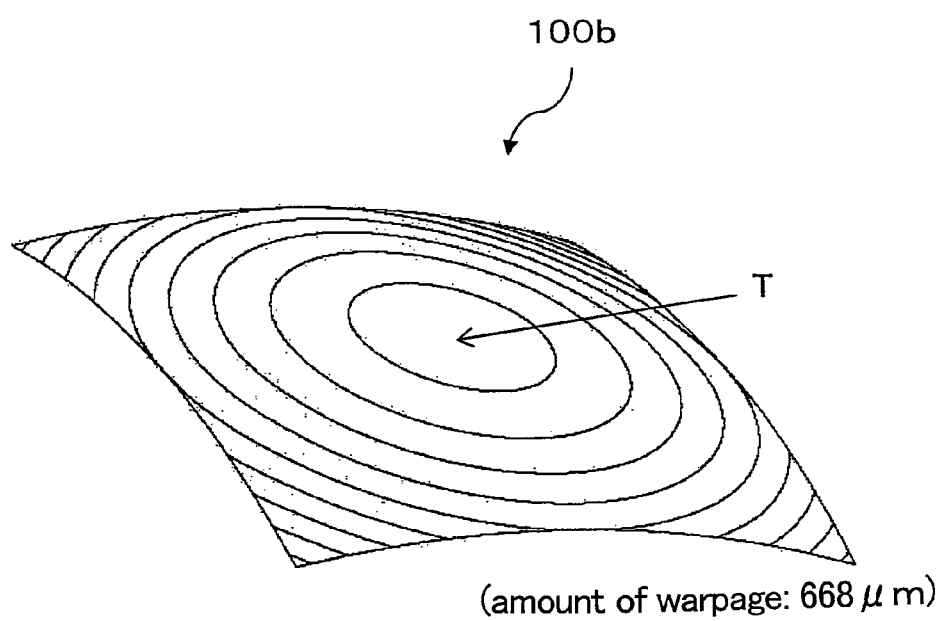
FIG. 4 is a diagram illustrating a warpage simulation result for the multilayered wiring board of FIG. 3.

FIG. 4 is a mapped warpage shape resulting from the simulation for the board 100b. FIG. 4 illustrates the top surface of the board 100b as obliquely viewed from above. A plurality of rings shown in the figure represent contour lines. The distance between a plane including four vertexes of the square top surface of the board 100b and the center T of the central ring represents the amount of warpage of the board 100b. The amount of warpage (the parenthesized number in the figure) resulting from the simulation is the same as the actual measurement value of 668 µm.

<Warpage Simulation No. 2>

Next, the warpage simulation results for the conventional board 100h shown in FIG. 13 will be described. The conventional board 100h uses plain-woven fiber bundles for the five resin base material layers (B1 to B5). The copper remaining ratios of the wiring layers are the same as those described in the above example, i.e., 32%, 28%, 37%, 46%, 52%, and 54% in order from the wiring layer C1 shown in FIG. 12. The thickness of the wiring layers C (10 µm) and the resin base material layers B (30 µm) and the size of the board (50 mm×50 mm) are the same as those described in the above example. Physical properties of the elements of the board in the warpage simulation are also the same as those described in the above example.

Figure 14:
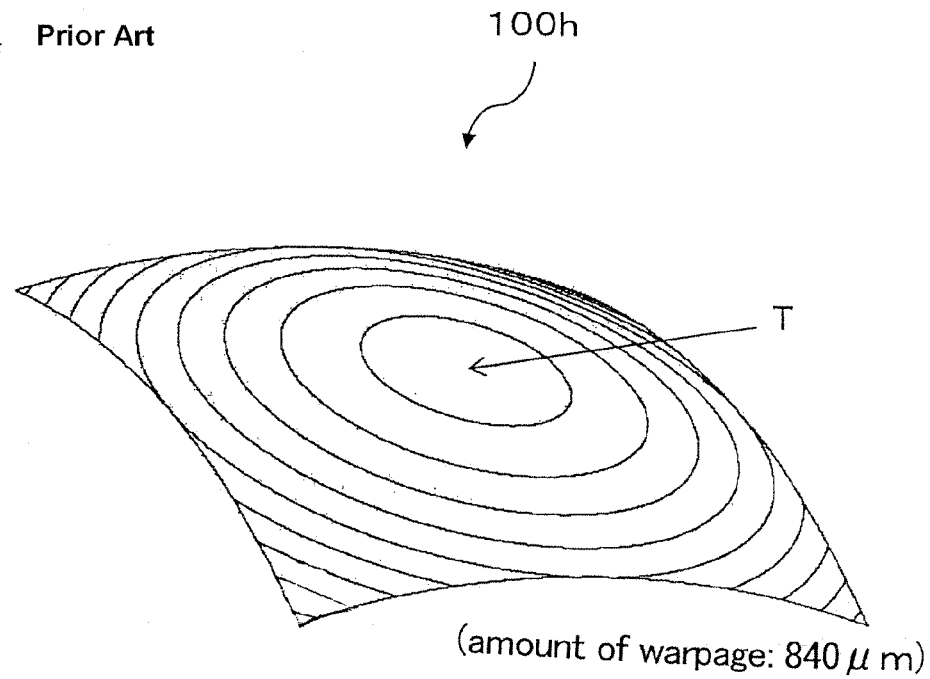
FIG. 14 is a diagram illustrating a warpage simulation result for the multilayered wiring board of FIG. 13.

FIG. 14 illustrates the warpage shape of the conventional board 100h resulting from the simulation. The amount of warpage in the simulation is the same as the actual measurement value of 840 µm. When comparing the results between FIGS. 4 and 14, the amount of warpage in FIG. 4 (board 100b) is 668 µm, whereas the amount of warpage in FIG. 14 (board 100h) is 840 µm. Accordingly, it is appreciated that the present invention reduces warpage by approximately 20%.

In the board 100h shown in FIG. 13 where the weaves of the resin base material layers B are composed of only one type of plain-woven fiber bundles, warpage during heating occurs due to the difference in the amount of thermal expansion between the wiring layers C, which is attributed to the difference in the copper remaining ratio between the wiring layers.

In the case of the board 100h, the copper remaining ratio increases from the wiring layer C1 toward the bottom in order: 32%, 28%, 37%, 46%, 52%, and 54%. As a result, force convexly warping the board 100h is applied to the six wiring layers C due to heating.

On the other hand, in the case of the board 100b shown in FIG. 3, the fiber bundle weave (twill weave) of the resin base material layer B4 differs from the weaves (plain weave) of the other build-up layers 105 (resin base material layers B1, B2, and B5). Accordingly, the resin base material layer B4 has a greater amount of thermal expansion than the other resin base material layers, and therefore force concavely warping the board is applied to the five resin base material layers B during heating. Thus, the force concavely warping the resin base material layers B cancels the force convexly warping the wiring layers C, thereby reducing warpage during heating.

<Warpage Simulation No. 3>

Figure 5:
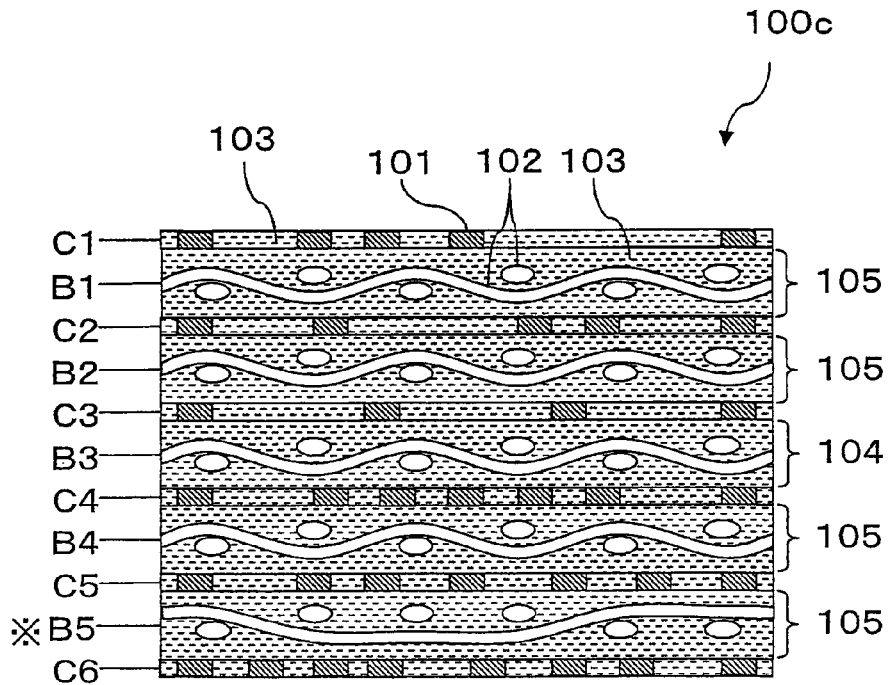
FIG. 5 is a cross-sectional view illustrating the structure of a multilayered wiring board used in warpage simulation No. 3.

FIG. 5 illustrates the structure of a board 100c. The board 100c includes six wiring layers (from top, C1 to C6), and five resin base material layers (from top, B1, B2 (build-up layers 105), B3 (base layer 104), and B4 and B5 (build-up layers 105)) between the wiring layers C. Also, the copper remaining ratios of the wiring layers C are 32%, 28%, 37%, 46%, 52%, and 54% in order from the wiring layer C1. Their arrangement and structure are the same as in the case of the board 100b.

The board 100c in FIG. 5 uses plain-woven fiber bundles for the resin base material layers B1, B2, B3, and B4, and twill-woven fiber bundles only for the bottommost resin base material layer B5 (assigned "*" in FIG. 5).

Other characteristics, i.e., the thickness of the wiring layers C and the resin base material layers B, and board size, are the same as in the case of the board 100b, and the fiber bundle content is 33% by weight for both the resin base material layers using plain-woven fiber bundles and the resin base material layers using twill-woven fiber bundles, as in the case of the board 100b. Also, physical properties of the elements of the board in the warpage simulation are also the same as those described in the above example.

Figure 6:
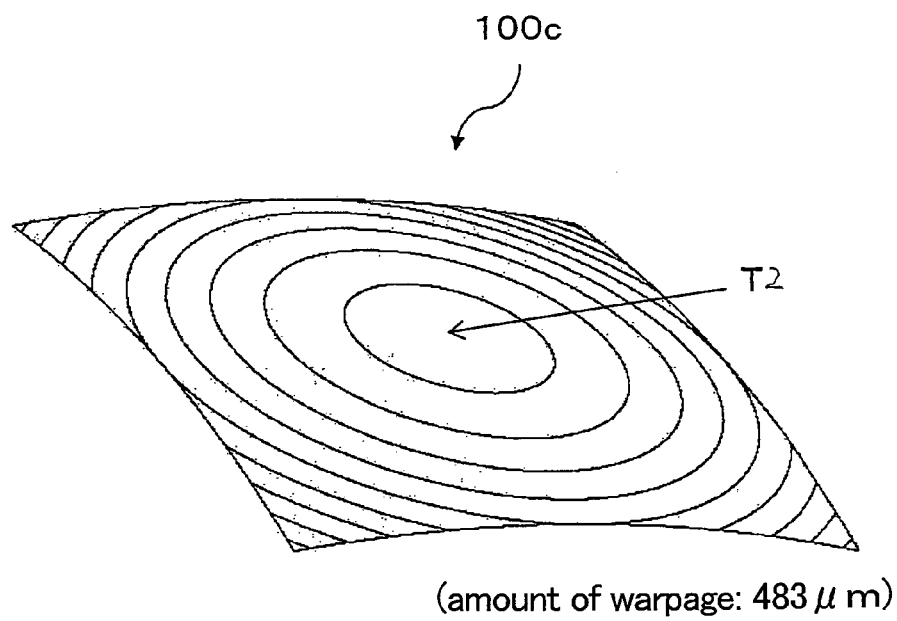
FIG. 6 is a diagram illustrating a warpage simulation result for the multilayered wiring board of FIG. 5.

FIG. 6 illustrates warpage resulting from the simulation where the board is heated up to 260° C. during reflow process. When comparing the results between FIGS. 6 and 14, the amount of warpage, which is 840 μm in FIG. 14 (board 100h), is 483 μm in FIG. 6 (board 100c), which indicates that the present invention reduces warpage by approximately 43%.

In the case of the board 100c shown in FIG. 5, the weave (twill weave) of the resin base material layer B5 differs from the weave (plain weave) of the other resin base material layers, so that the resin base material layer B5 has a greater amount of thermal expansion than the other resin base material layers. Accordingly, force concavely warping the board 100c is applied to the five resin base material layers B during heating. Thus, the force concavely warping the resin base material layers B cancels the force convexly warping the wiring layers C, thereby reducing warpage during heating.

<Warpage Simulation No. 4>

Figure 7:
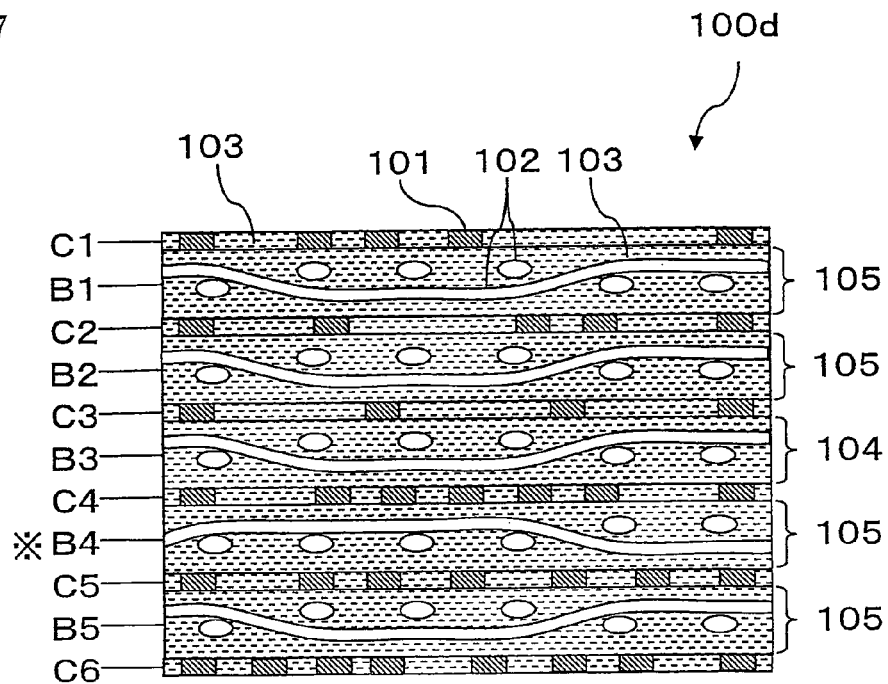
FIG. 7 is a cross-sectional view illustrating the structure of a multilayered wiring board used in warpage simulation No. 4.

FIG. 7 illustrates the structure of a board 100d based on twill-woven resin base material layers. The board 100d includes six wiring layers (from top, C1 to C6), and five resin base material layers (from top, B1, B2 (build-up layers 105), B3 (base layer 104), and B4 and B5 (build-up layers 105)) between the wiring layers. Also, the copper remaining ratios of the wiring layers are 32%, 28%, 37%, 46%, 52%, and 54% in order from C1. Their arrangement and structure are the same as in the case of the board 100b.

The board 100d in FIG. 7 uses twill-woven fiber bundles for the resin base material layers B1, B2, B3, and B5, and satin-woven fiber bundles only for the resin base material layer B4 (assigned "*" in FIG. 7) underlying the base layer 104.

Other characteristics, i.e., the thickness of the wiring layers C and the resin base material layers B and board size, are the same as in the case of the board 100b. The fiber bundle content is 33% by weight for both the resin base material layers using twill-woven fiber bundles and the resin base material layers using satin-woven fiber bundles, as in the case of the board 100b. Also, physical properties of the elements of the board in the warpage simulation are the same as those described in the above example.

Figure 8:
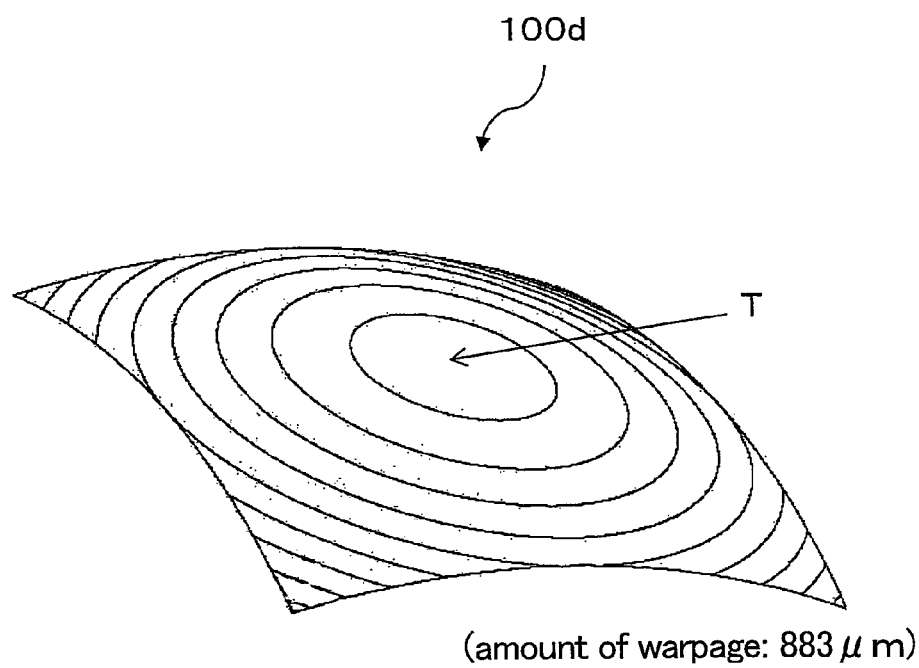
FIG. 8 is a diagram illustrating a warpage simulation result for the multilayered wiring board of FIG. 7.

FIG. 8 illustrates a warpage shape resulting from the warpage simulation where the board is heated up to 260° C. during reflow process. In the simulation, the amount of warpage was 883

<Warpage Simulation No. 5>

Next, warpage simulation results for a board 100i shown in FIG. 15 will be described. The board 100i differs from the conventional board 100h shown in FIG. 13 in that the five resin base material layers (B1 to B5) use twill weave rather than plain weave, and the fiber bundle content of the resin base material layers of the board 100i is 33% by weight as in the case of the conventional board 100h. The copper remaining ratios of the wiring layers C, the thickness of the wiring layers C and the resin base material layers B, and board size are the same as those described in the above example. Also, physical properties of the elements of the board in the warpage simulation are also the same as those described in the above example.

Figure 16:
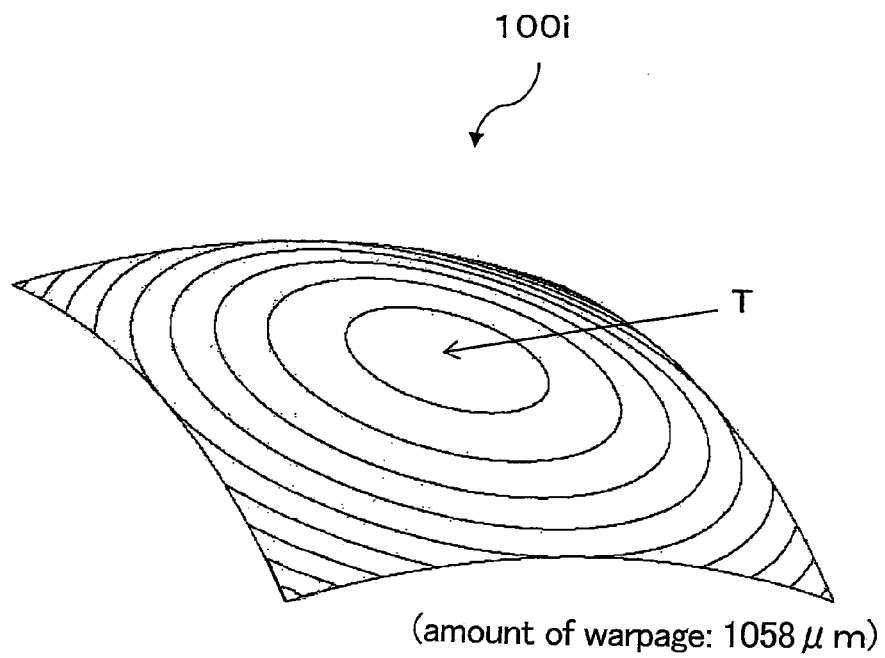
FIG. 16 is a diagram illustrating a warpage simulation result for the multilayered wiring board of FIG. 15.

FIG. 16 illustrates a warpage shape resulting from the simulation for the board 100i. In the simulation, the amount of warpage was 1058 μm. When comparing the results between FIGS. 8 and 16, the amount of warpage in FIG. 8 (board 100d) is 883 μm, and the amount of warpage in FIG. 16 (board 100i) is 1058 μm. Accordingly, it is appreciated that warpage of the board 100d is reduced by approximately 17% compared to the board 100i.

Figure 15:
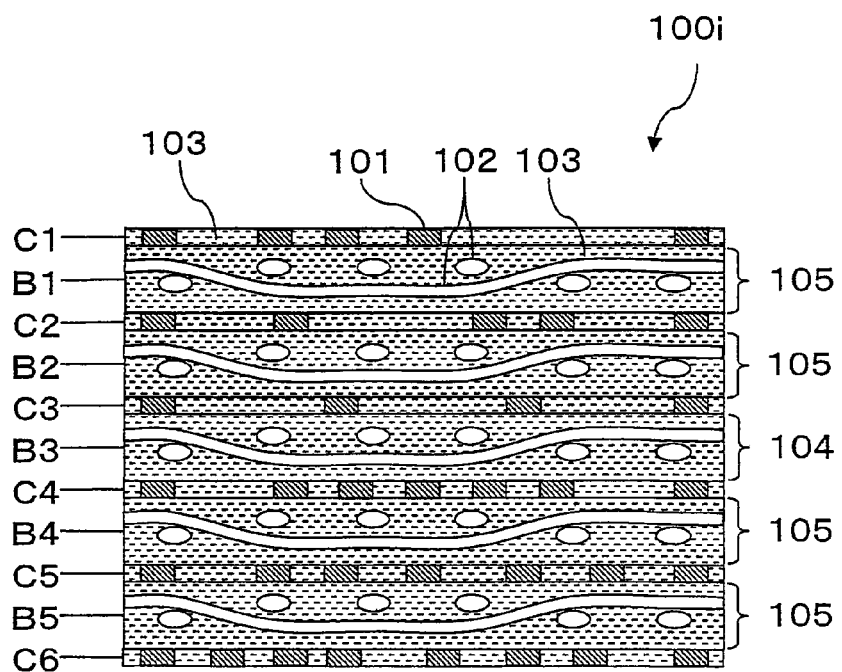
FIG. 15 is a cross-sectional view illustrating the structure of a conventional multilayered wiring board used in warpage simulation No. 5.

In the board 100i shown in FIG. 15 where the resin base material layers B use only one type of weave (twill weave), warpage during heating occurs due to the difference in the amount of thermal expansion between the wiring layers C, which is attributed to the difference in the copper remaining ratio between the wiring layers. In the case of the board 100i, the copper remaining ratio increases from the wiring layer C1 toward the bottom in order: 32%, 28%, 37%, 46%, 52%, and 54%, and therefore force convexly warping the board 100i is applied to the six wiring layers C.

On the other hand, in the case of the board 100d shown in FIG. 7, the weave (satin weave) of the resin base material layer B4 differs from the weave (twill weave) of the other build-up layers. The resin base material layer B4 has a greater amount of thermal expansion than the other resin base material layers, and therefore force concavely warping the board is applied to the five resin base material layers B during heating. Thus, the force concavely warping the resin base material layers B cancels the force convexly warping the wiring layers C, thereby reducing warpage during heating.

<Warpage Simulation No. 6>

Figure 9:
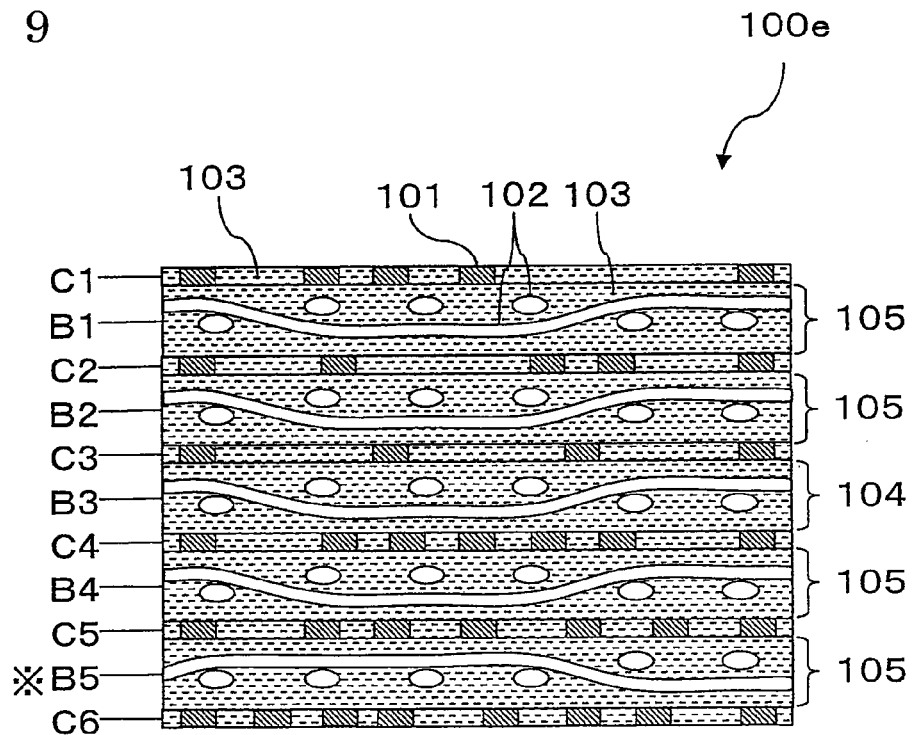
FIG. 9 is a cross-sectional view illustrating the structure of a multilayered wiring board used in warpage simulation No. 6.

FIG. 9 illustrates the structure of a board 100e. The board 100e includes six wiring layers (from top, C1 to C6), and five resin base material layers (from top, B1, B2 (build-up layers 105), B3 (base layer 104), and B4 and B5 (build-up layers 105)) between the wiring layers. The copper remaining ratios of the wiring layers C are 32%, 28%, 37%, 46%, 52%, and 54% in order from the wiring layer C1. Their arrangement and structure are the same as in the case of the board 100b.

The board 100e in FIG. 9 uses twill-woven fiber bundles for the resin base material layers B1, B2, B3, and B4, and satin-woven fiber bundles only for the bottommost resin base material layer B5 (assigned "*" in FIG. 9).

Other characteristics, i.e., the thickness of the wiring layers C and the resin base material layers B, and board size, are the same as in the case of the board 100b. Physical properties of the elements of the board in the warpage simulation are also the same as those described in the above example.

Figure 10:
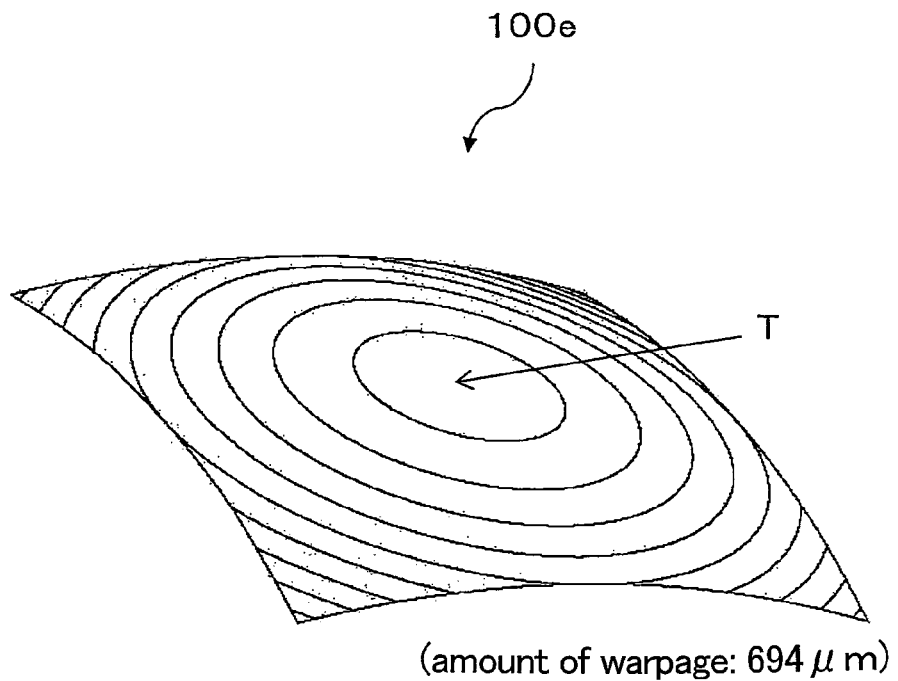
FIG. 10 is a diagram illustrating a warpage simulation result for the multilayered wiring board of FIG. 9.

FIG. 10 illustrates warpage resulting from the simulation where the board is heated up to 260° C. during reflow process. When comparing the results between FIGS. 10 and 16, the amount of warpage in FIG. 10 (board 100e) is 694 µl, and the amount of warpage is 1058 µm in FIG. 16 (board 100i), which indicates that the present invention reduces warpage by approximately 34%.

In the case of the board 100e shown in FIG. 9, the fiber bundle weave (satin weave) of the resin base material layer B5 differs from the weave (twill weave) of the other resin base material layers. The resin base material layer B5 has a greater amount of thermal expansion than the other resin base material layers, and therefore force concavely warping the board is applied to the five resin base material layers B during heating. Thus, the force concavely warping the resin base material layers B cancels the force convexly warping the wiring layers C, thereby reducing warpage during heating.

As shown in the warpage simulation result, the board 100c has a greater effect of reducing board warpage than the board 100b. Also, the board 100e has a greater effect of reducing board warpage than the board 100d. This results from the arrangement of the resin base material layers, and the greatest effect can be achieved when a resin base material layer using a different fiber bundle weave from the base fiber bundle weave is arranged as the outermost resin base material layer.

Table 2 summarizes warpage simulation results where one of the resin base material layers uses a different fiber bundle weave from the other resin base material layers, which use a base fiber bundle weave. In the target board, as in the board 100b in FIG. 3, the copper remaining ratios of the wiring layers are 32%, 28%, 37%, 46%, 52%, and 54% in order from the wiring layer C1, and the thickness of the wiring layers C and the resin base material layers B and the fiber bundle content are also the same as in the case of the board 100b.

material layers using one type of weave. On the other hand, italicized values denote warpage increase or reverse warpage compared to the resin base material layers using one type of weave. Note that the results for simulation Nos. 1 to 6 are denoted by symbols *1 to *6 in the table.

As for the underlined amounts of curvature in Table 2, one of the five resin base material layers B uses fiber bundles woven differently (i.e., different in the crossing point density) from the base layers. Thus, the force concavely warping the resin base material layers B cancels the force convexly warping the wiring layers C, thereby reducing warpage during heating without increasing warpage or causing reverse warpage.

However, as shown in Table 2, when the base weave is plain weave or twill weave, and non-woven fabric is the one different type of weave and arranged as the layer B5, reverse warpage occurs exceptionally. The reason for this is that using non-woven fabric as one of the resin base material layers results in excessively large force concavely warping the board, thereby reversing convex board warpage.

To avoid such a situation, see, for example, "Analysis of Stress and Deflection of Printed Plate Board Using Multilayered Beam Theory" (Juhachi Oda and Shingo Abe, Transactions of the Japan Society of Mechanical Engineers (A), Vol. 59, No. 563, pp. 203-208). When two or more types of weaves are used for resin base material layers, it is preferable that predictions be made based on the multilayered beam theory described in this publication, regarding whether or not board warpage increases or whether or not reverse warpage occurs. In such a case, it is preferable that the modulus of longitudinal elasticity and the linear expansion coefficient be calculated in advance for each of the wiring layers and the resin base material layers.

Figure 11:
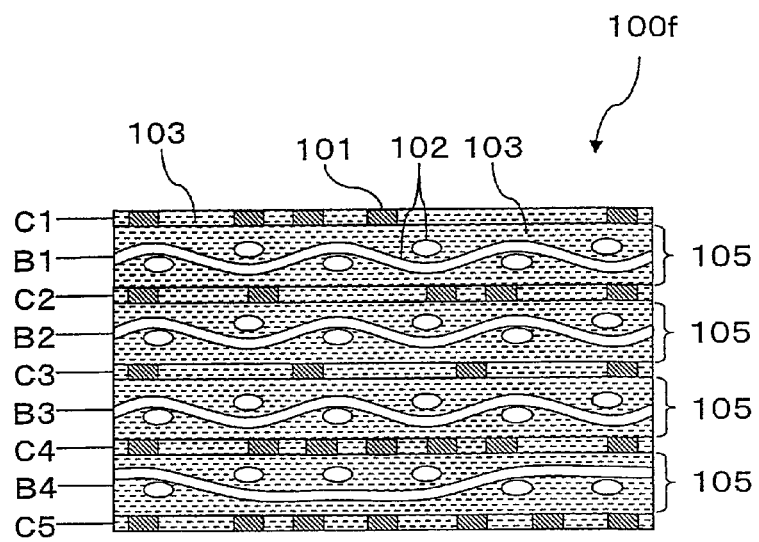
FIG. 11 is a cross-sectional view illustrating the structure of a multilayered wiring board according to another embodiment of the present invention.

While the above embodiment has been described with respect the boards including five resin base material layers, the present invention is not limited to this. Also, the above embodiment has been described with respect to the case where the board has the base layer 104 at the center, i.e., the board has an even number of wiring layers, the present invention is not limited to this. Even in the case as shown in FIG. 11 where a board 100f includes build-up layers 105 but no base

TABLE 2

| one different weave | | base weave | | | |
|---|---|---|---|---|---|
| | | plain | twill | | |
| | different layer | weave | weave | satin weave | non-woven |
| plain weave | B4 | *2 _840 µm_ | _1233 µm_ | _1624 µm_ | _2875 µm_ |
| | B5 | | _1420 µm_ | _2000 µm_ | _3781 µm_ |
| twill weave | B4 | *1 _668 µm_ | *5 _1058 µm_ | _1448 µm_ | _2688 µm_ |
| | B5 | *3 _482 µm_ | | _1637 µm_ | _3401 µm_ |
| satin weave | B4 | _495 µm_ | *4 _883 µm_ | _1272 µm_ | _2504 µm_ |
| | B5 | _121 µm_ | *6 _694 µm_ | | _3024 µm_ |
| non-woven | B4 | _56 µm_ | _432 µm_ | _812 µm_ | _888 µm_ |
| | B5 | _–809 µm_ | _–252 µm_ | _343 µm_ | |

In the table, rows denote base fiber bundle weaves, and columns denote one different type of fiber bundle weave and layers using that different weave. Numerical values in the table denote the amount of warpage resulting from the warpage simulation, and italicized and underlined values denote resin base material layers using one type of weave rather than using different types of weave. Also, underlined values denote warpage reduction compared to the resin base layer 104 at the center, i.e., the number of wiring layers is odd, the present invention achieves effects similar to those achieved in the above embodiment.

For example, when an average for the copper remaining ratios of the wiring layers underlying the central wiring layer of the board is greater than an average for the copper remaining ratios of the overlying wiring layers, board warpage can be reduced by either of the following methods:

(1) for at least one of the underlying build-up layers 105 of the board, fiber bundles woven with a greater amount of thermal expansion than in the other build-up layers 105 are used; and (2) for at least one of the overlying build-up layers 105 of the board, fiber bundles woven with a smaller amount of thermal expansion than in the other build-up layers 105 are used.

Also, the above embodiment has been described with respect to the case where one resin base material layer differs in fiber bundle weave from other resin base material layers, but this is not restrictive. The present invention is applicable to the case where two or more resin base material layers differ in fiber bundle weave from other resin base material layers.

Furthermore, the above embodiment has been described with respect to the case where the resin base material layers have a constant fiber bundle content. However, the amount of thermal expansion of the resin base material layers can also be adjusted by changing the fiber bundle content of the resin base material layers. Accordingly, multilayered wiring board warpage can be more flexibly reduced by combining the use of fiber bundles of the present invention, which are different in the crossing point density, and the change of the fiber bundle content of the resin base material layers.

As described above, the multilayered wiring board according to the present invention includes at least one resin base material layer using fiber bundles different in the crossing point density from those of other layers, thereby rendering the resin base material layers different in the amount of thermal expansion. Specifically, board warpage as caused during reflow soldering can be reduced by canceling the difference in the amount of thermal expansion between wiring layers, which results from the difference in the copper remaining ratio between the wiring layers, with the difference in the amount of thermal expansion between resin base material layers.

The above-described multilayered wiring board of the present invention can be used in various applications, including mobile electronic equipment, as a wiring board to be mounted for forming an electronic circuit for a digital mobile product.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

The invention claimed is:

1. A multilayered wiring board comprising n wiring layers including wiring and a first insulating resin, and (n−1) resin base material layers including fiber bundles impregnated with a second insulating resin, where n is an integral number of 4 or more, the n wiring layers and the (n−1) resin base material layers being alternately laminated, wherein:

at least one of the (n−1) resin base material layers is an adjustment layer with fiber bundles different in a crossing point density from those of other resin base material layer or layers of the (n−1) resin base material layers, the crossing point density is a number of crossing points between warp and well threads per unit area, the fiber bundles of the (n−1) resin base material layers including the adjustment layer include a woven fabric in a twill weave, a satin weave or a plain weave the n wiring layers are stacked so that a first wiring layer to a n-th wiring layer are stacked in this order and the (n−1) resin base material layers are stacked so that a first resin base material layer to a (n−1)-th resin base material layer are stacked in this order, the first wiring layer is adjacent to the first resin base material layer and the n-th wiring layer is adjacent to the (n−1)-th resin base material layer, and the adjustment layer is arranged so as to reduce an amount of warpage during heating as calculated based on a difference in a copper remaining ratio between each of the n wiring layers.

2. The multilayered wiring board according to claim 1, wherein:

the n is an even number of 4 or more, an average for copper remaining ratios of the first wiring layer to a (n/2)-th ring layer of the n wiring layers from one surface in the laminating direction is lower than an average for copper remaining ratios of a [(n/2)+1]-th wiring layer to the n-th wiring layer of the n wiring layers, and at least one of a [(n/2)+1]-th resin base material layer to the (n−1)-th resin base material layer of the (n−1) resin base material layers is the adjustment layer with the fiber bundles having a lower crossing point density than those in the other resin base material layers.

3. The multilayered wiring board according to claim 2, wherein the adjustment layer with the fiber bundles having the lower crossing point density than those in the other resin base material layers is the (n−1)-th resin base material layer.

4. The multilayered wiring board according to claim 2, wherein the fiber bundles of the adjustment layer are of the twill weave, and the fiber bundles of the other base resin material layer or layers are of the plain weave.

5. The multilayered wiring board according to claim 2, wherein the fiber bundles of the adjustment layer are of the satin weave, and the fiber bundles of the other base resin material layer or layers are of the plain weave.

6. The multilayered wiring board according to claim 2, wherein the fiber bundles of the adjustment layer are of the satin weave, and the fiber bundles of the other base resin material layer or layers are of the twill weave.

7. The multilayered wiring board according to claim 1, wherein:

the n is an even number of 4 or more, an average for copper remaining ratios of the first wiring layer to a (n/2)-th wiring layer of the n wiring layers from one surface in the laminating direction is lower than an average for copper remaining ratios of a [(n/2)+1]-th wiring layer to the n-th wiring layer of the n wiring layers, and at least one of the first resin base material layer to a [(n/2)−1]-th resin base material layer of the (n−1) resin material base layers is the adjustment layer with the fiber bundles having a higher crossing point density than those in the other resin base material layers.

8. The multilayered wiring board according to claim 7, wherein the adjustment layer with the fiber bundles having a higher crossing point density than those in the other resin base material layers is the first resin base material layer.

9. The multilayered wiring board according to claim 1, wherein:
the n is an odd number of 5 or more,
an average for copper remaining ratios of the first wiring layer to a [(n−1)/2]-th wiring layer of the n wiring layers from one surface in the laminating direction is lower than an average for copper remaining ratios of a [(n+3)/2]-th wiring layer to the n-th wiring layer of the n wiring layers, and
at least one of a [(n+1)/2]-th resin base material layer to the (n−1)-th resin base material layer of the (n−1) resin base material layers is the adjustment layer with the fiber bundles having a lower crossing point density than those in the other resin base material layers.

10. The multilayered wiring board according to claim 1, wherein:
the n is an odd number of 5 or more,
an average for copper remaining ratios of the first wiring layer to a [(n−1)/2]-th wiring layer of the n wiring layers from one surface in the laminating direction is lower than an average for copper remaining ratios of a [(n+3)/2]-th wiring layer to the n-th wiring layer of the n wiring layers, and
at least one of the first resin base material layer to a [(n−1)/2]-th resin base material layer of the (n−1) resin base material layers is the adjustment layer with the fiber bundles having a higher crossing point density than those in the other resin base material layers.

* * * * *